United States Patent [19]
Dawson et al.

[11] Patent Number: 5,351,163
[45] Date of Patent: Sep. 27, 1994

[54] HIGH Q MONOLITHIC MIM CAPACITOR

[75] Inventors: Dale E. Dawson, Glen Burnie; Albert A. Burk, Jr., Sykesville; Harlan C. Cramer, Columbia; Ronald C. Brooks, Bel Air; Howell G. Henry, Baltimore, all of Md.

[73] Assignee: Westinghouse Electric Corporation, Pittsburgh, Pa.

[21] Appl. No.: 998,219

[22] Filed: Dec. 30, 1992

[51] Int. Cl.$^5$ .............................................. H01G 4/10
[52] U.S. Cl. .................. 361/321.1; 361/762; 257/68; 257/277; 257/532
[58] Field of Search .............. 361/321.1, 311, 762, 361/763, 766; 257/68, 277, 532, 535; 29/25.42

[56] References Cited

U.S. PATENT DOCUMENTS

| | | | |
|---|---|---|---|
| 4,153,988 | 5/1979 | Doo | 361/762 X |
| 4,908,805 | 3/1990 | Sprenkels et al. | 367/181 |
| 4,910,840 | 3/1990 | Sprenkels et al. | 29/25.41 |
| 4,920,390 | 4/1990 | Fuse et al. | 357/23.6 |
| 4,996,627 | 2/1991 | Zias et al. | 361/283.4 |
| 5,026,658 | 6/1991 | Fuse et al. | 437/52 |

FOREIGN PATENT DOCUMENTS 1576704  5/1978  United Kingdom.

Primary Examiner—Marvin M. Lateef

[57] ABSTRACT

A high Q monolithic metal-insulator-metal (MIM) capacitor utilizing a single crystal dielectric material. A dielectric membrane is epitaxially grown on a substrate. The membrane acts as an etch-stop when a backside etch is used to form a cavity in the substrate, resulting in a single crystal dielectric membrane spanning the cavity. Electrodes are formed on opposite surfaces of the membrane at the cavity location. For a shunt capacitor application, the bottom electrode is connected to the backside substrate metallization. For a series capacitor application, the bottom electrode is isolated from the backside metallization, but is connected to the topside circuitry through a via formed in the membrane. The membrane may consist of two dielectric layers, where the first layer is an etchstop material. In one embodiment the substrate and second dielectric layer are gallium arsenide and the first dielectric layer is aluminum gallium arsenide.

9 Claims, 3 Drawing Sheets

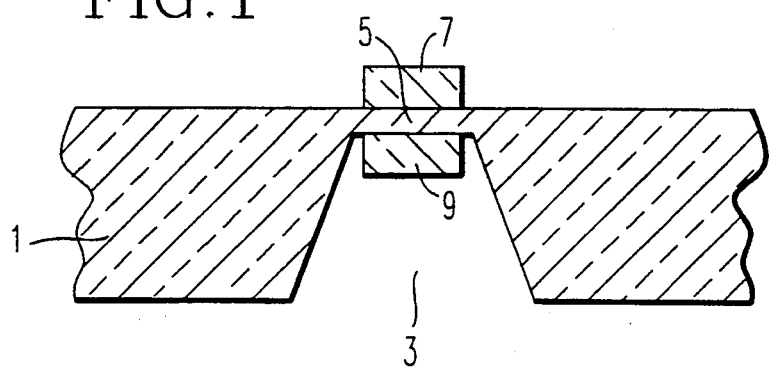
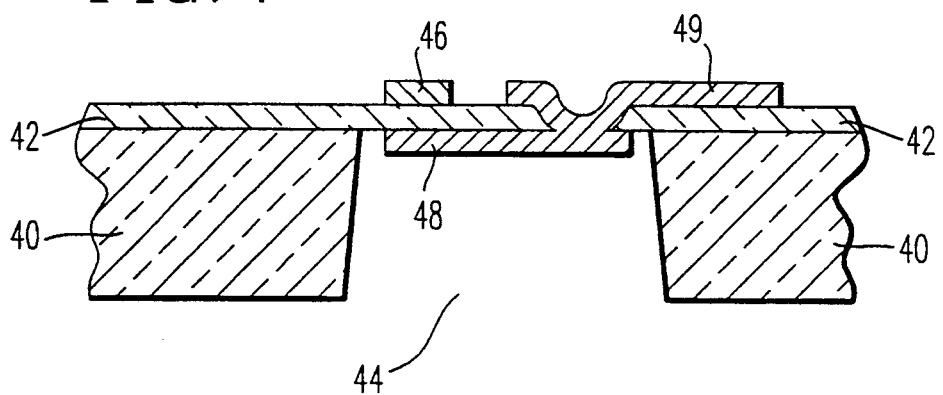

HIGH Q MONOLITHIC MIM CAPACITOR

This invention was made with government support under contract MDA 972-89-C-0030 awarded by the Defense Advanced Research Project Agency. The government has certain rights in this invention.

BACKGROUND OF THE INVENTION

This invention relates to the field of electrical capacitors, and in particular, it concerns a high Q monolithic metal-insulator-metal (MIM) capacitor.

The elements which limit the performance of small, monolithic filters are the capacitors rather than the inductors. MIM capacitors would be ideal elements for monolithic filters if it were not for the low Q of the thin film dielectrics. Thin film capacitors are limited to Q's of typically 20 to 50 due to the low loss tangents of thin film dielectric materials, such as sputtered $SiO_2$. The Q of a MIM capacitor would be approximately 800 at X-band if it were controlled by metal losses alone. This can have a significant impact on the performance of a filter design. For example, a typical elliptic filter with series and shunt capacitor Q's of 25 may have an insertion loss of 4 dB over a passband of 9-10 GHz, while a similar filter with capacitor Q's of 800 may have an insertion loss of only 0.6 dB.

A further need for high Q capacitors is in the area of superconducting circuits. The increased use of thin film superconductors highlights the need for small, lumped element, low loss, monolithic filters. Such superconducting filters will not be possible without eliminating the lossy capacitor dielectric as a fundamental limitation.

SUMMARY

In light of the limitations of existing monolithic capacitors, it is an object of this invention to describe a capacitor which can be formed as a monolithic device and which exhibits a higher Q than existing devices. It is a further object of this invention to describe a high Q monolithic capacitor design which can be formed as a series or a shunt capacitor. Accordingly, a capacitor is described which consists of a substrate having a cavity therein, a dielectric membrane disposed on the substrate and over the cavity, a first conductor disposed on the dielectric membrane over the cavity, and a second conductor disposed under the dielectric membrane within the cavity. The dielectric membrane is preferably in single crystal form. The dielectric membrane can act as an etch-stop material during the backside etch process used to form the cavity. In this manner the thickness of the dielectric between the conductors can be controlled during the epitaxial growth of that layer. The second conductor may be connected to or isolated from the substrate backside metallization for shunt or series applications respectively. For series applications the second conductor is connected to topside circuitry through a via formed through the membrane.

BRIEF DESCRIPTION OF THE DRAWINGS

FIG. 1 illustrates a high Q monolithic MIM capacitor.

FIG. 4 illustrates an embodiment of this invention where the membrane consists of only one layer.

DETAILED DESCRIPTION OF THE INVENTION

This invention makes use of a bulk, single crystal semiconductor as the dielectric material in a metal-insulator-metal (MIM) capacitor. A parallel plate configuration is used rather than an interdigitated structure because an interdigitated structure is edge-coupled and has increased losses due to the high current density along the interdigitated fingers.

In order to obtain the desired high Q capacitor, the thin film dielectric should be in single crystal form. One such device is illustrated in FIG. 1, where a substrate 1 of single crystal material, such as gallium arsenide, is etched to form a cavity 3. The etch process is controlled to produce a dielectric membrane 5 of a desired thickness. Conductors 7 and 9, typically gold or aluminum, are formed on opposed sides of the membrane 5 to form a capacitor structure having a single crystal dielectric. Due to the difficulties of controlling typical etching processes, it is difficult to control the thickness of membrane 5 to a high degree of precision. In applications where a higher degree of precision is required, the etching process can be controlled with an etch-stop material, as illustrated in FIGS. 2A-2C.

Figure 2A:
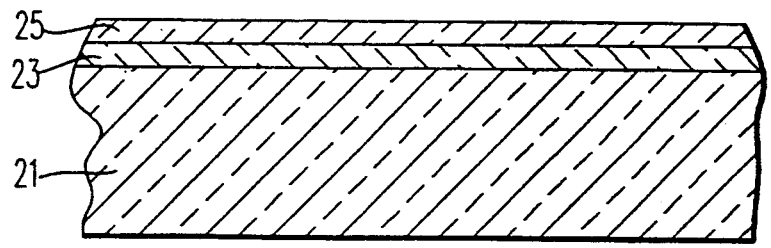
FIGS. 2A-2C illustrate the sequence of steps used to fabricate a shunt capacitor in accordance with this invention, using an etch-stop material.
Figure 2B:
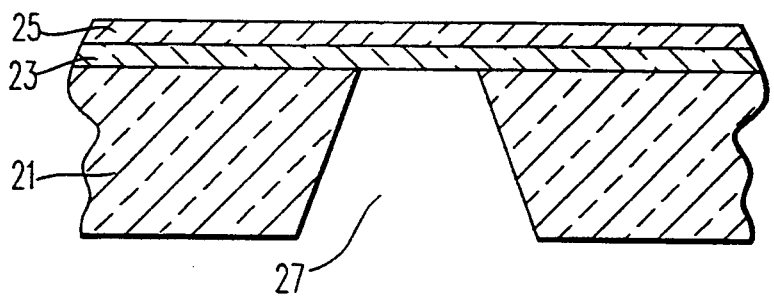
Figure 2C:
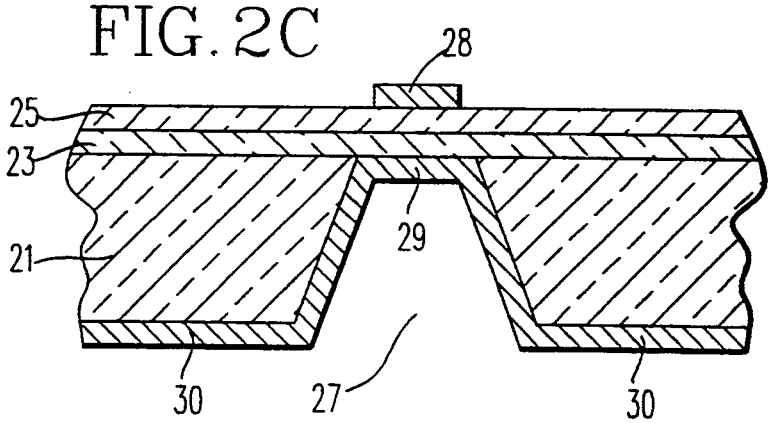

In FIG. 2A, a dielectric substrate 21 has formed upon it a first layer of dielectric material 23 and a second layer of dielectric material 25. These materials are selected to permit the first layer 23 and second layer 25 to be formed as single crystal structures. The material of the first layer 23 is further selected to act as an etch-stop for a backside etch process which functions to form a cavity 27 in the substrate 21, as shown in FIG. 2B. In one embodiment of this invention the substrate 21 may be gallium arsenide, the first layer 23 may be epitaxially grown aluminum gallium arsenide, and the second layer 25 may be epitaxially grown gallium arsenide. In this embodiment, cavity 27 may be formed with a hydrogen peroxide etch, since the aluminum gallium arsenide layer 23 will act as an etch-stop for the hydrogen peroxide, resulting in a uniformly thick membrane 23, 25 consisting of first layer 23 and second layer 25 formed over cavity 27. The thickness of the first layer 23 need be only enough to stop the etch process, for example 0.1 micron. The thickness of the second layer 25 is determined by the desired capacitor characteristics, and may be for example 0.9 microns. An alternative embodiment may have a silicon substrate 21, a silicon germanium etch-stop layer 23, and a silicon layer 25. A first electrode 28 is then formed on the second layer 25 opposed the cavity 27, and a second electrode 29 is formed under the first layer 23 within the cavity 27 to form the parallel plate structure, as shown in FIG. 2C. The second electrode 29 can be integral with a metallization 30 over the entire backside of substrate 21 for the shunt capacitor design. The first electrode 28 and second electrode 29 are conductors, for example gold or aluminum. For superconducting applications the conductors may be formed from a superconducting material, such as YBaCuO.

In some applications the properties of the etchstop material may be acceptable as the capacitor dielectric without the addition of a second dielectric layer. FIG. 4 illustrates such a device, where a substrate 40 has formed upon it a dielectric layer 42, preferably a single crystal material. The dielectric layer 42 serves as an etch-stop material for an etch process which is used to form cavity 44. Conductors 46 and 48 are then deposited on opposite sides of dielectric layer 42 where it spans the cavity 44. In this embodiment the material and thickness of the dielectric layer 42 are selected to provide the desired capacitor performance. For applications requiring a series capacitor, a third conductor 49 may also be formed on the dielectric layer 42 and connected to conductor 48 through a via in the dielectric membrane.

Figure 3:
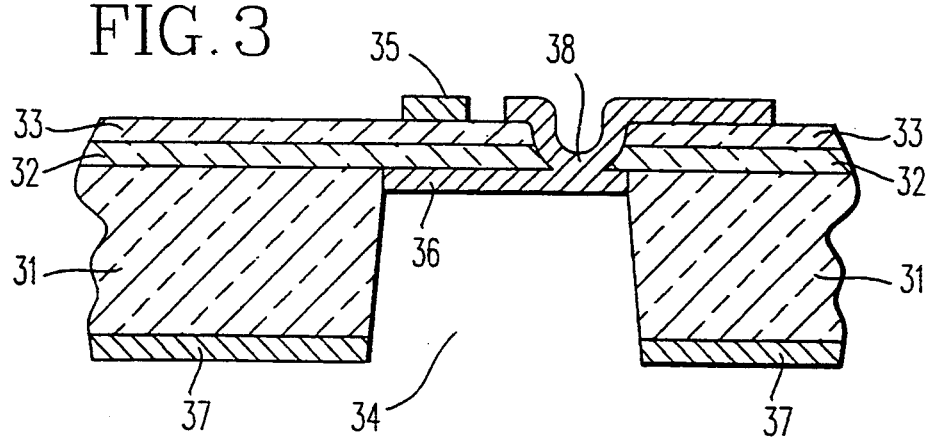
FIG. 3 illustrates a series capacitor built in accordance with this invention.

FIG. 3 illustrates an alternative embodiment of this invention formed as a series capacitor. Here again, a substrate 31 has formed upon it a first dielectric layer 32 and a second dielectric layer 33. A cavity 34 is then formed by etching the back surface of the substrate 31. The first layer 32 acts as a stop for the etchant, thereby forming a membrane 32, 33 consisting of first layer 32 and second layer 33. A first electrode 35 is formed on the second layer 33 opposed the cavity 34, and a second electrode 36 is formed under the first layer 32 within the cavity 34. The second electrode 36 of the series capacitor design is not connected to the backside metallization 37 on the wafer 31. Rather, a conductive path 38 to the wafer topside circuitry is accomplished through a via formed in both the first layer 32 and the second layer 33. The materials of construction of the series capacitor design may be the same as those described for embodiments of the shunt design described above.

The etch stop characteristic of the first dielectric layers 23, 32 illustrated in FIGS. 2B and 3 allows the capacitance of the device to be controlled by the thickness of the epitaxially grown layers 23, 25 and 32, 33, which can typically be maintained to a tolerance of 2% by techniques known in the art, such as MOCVD or MBE. Because the membranes 23, 25 and 32, 33 are formed as single crystal layers, they become a part of the substrate 21, 31, and therefore are mechanically strong and have a compatible thermal expansion coefficient. Venting of the cavity 27, 34 may also be done to relieve pressure under the capacitor due to changes in temperature or altitude.

Figure 5A:
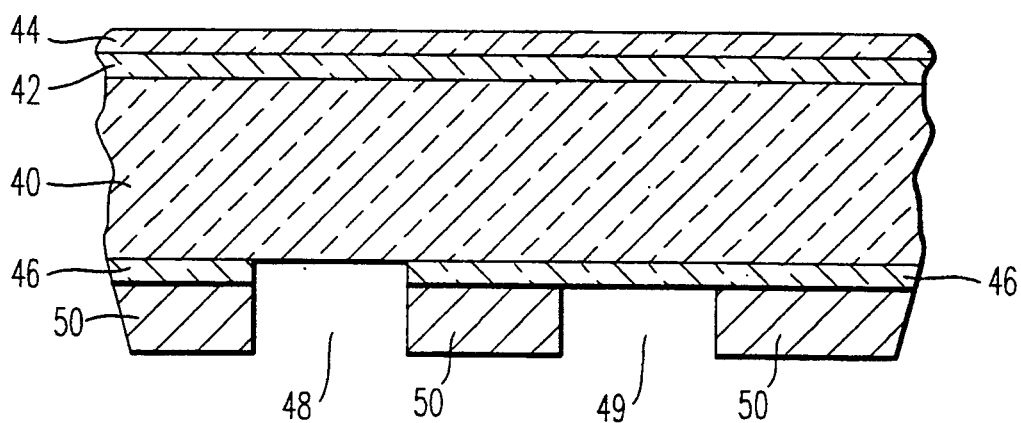
FIGS. 5A-5C illustrate the process of forming cavities for a series capacitor and a shunt capacitor on a single substrate.
Figure 5B:
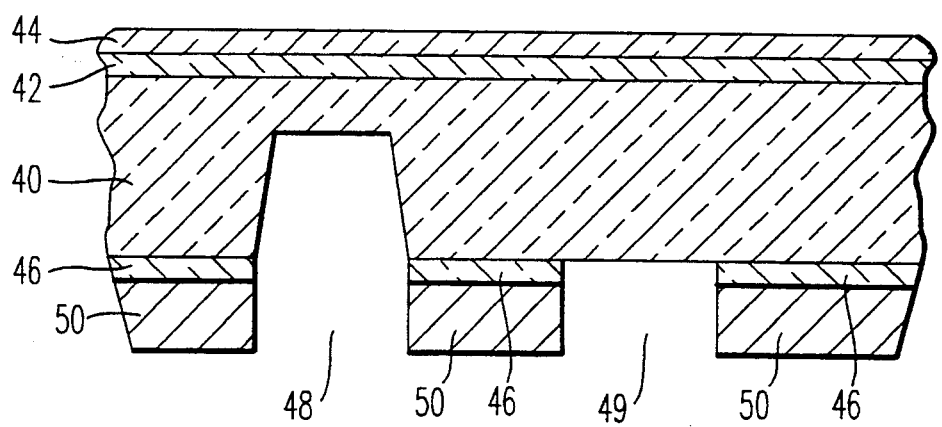
Figure 5C:
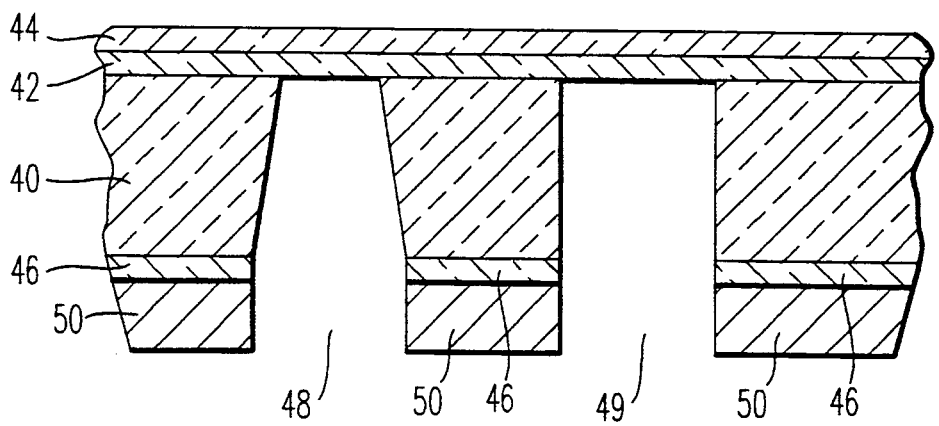

Because there should be no metallization on the walls of the cavity of a series capacitor built in accordance with this invention, it is desirable to form the walls to be nearly perpendicular to the surface of the substrate. The cavity of a shunt capacitor, on the other hand, should have tapered walls to facilitate metallization. For an application which requires both series and shunt capacitors on the same substrate, a process for forming the cavities is desired which will produce both tapered and straight walled cavities with a minimum number of process steps. FIGS. 5A–5C illustrate such a process. FIG. 5A shows a substrate 40 having first 42 and second 44 dielectric layers. A sacrificial mask material 46, such as silicon dioxide, is formed over a portion of the bottom surface of the substrate 40 by techniques known in the art. The location of the opening 48 in the mask material 46 corresponds to a location of a shunt capacitor to be formed. A photoresist material 50 with openings 48, 49 is then formed. The location of opening 49 corresponds to the location of a series capacitor to be formed. The backside of the substrate 40 is then exposed to an isotropic etch process for the period of time necessary to remove the sacrificial mask material 46 under opening 49, resulting in the geometry shown in FIG. 5B. Because the material of the substrate 40 will etch faster than the mask material 46, the isotope etch process forms a tapered cavity under opening 48. Thereafter, an anisotropic etch process is applied to the backside of the substrate 40, resulting in the formation of the structure shown in FIG. 5C. The anisotropic etch process creates a straight walled cavity under opening 49 for the series capacitor. The cavity under opening 48 is further enlarged during this process as the etch proceeds through the substrate material 40 to the first dielectric layer 42 which serves as an etch-stop. The anisotropic etch process is terminated when the cavity under opening 49 reaches the first dielectric layer 42. The resulting geometry shown in FIG. 5C has one cavity 49 with vertical walls for the series capacitor and one tapered cavity 48 for the shunt capacitor.

This disclosure reveals the preferred embodiment of the invention. However, variations in the form, fabrication and arrangement of components are possible without departing from the scope of the invention as claimed.

We claim:

1. A capacitor comprising:
   a substrate having a cavity therein;
   a dielectric membrane disposed on said substrate and spanning said cavity;
   a first conductor disposed on a top surface of said membrane opposed said cavity;
   a second conductor disposed on a bottom surface of said membrane within said cavity.

2. The device of claim 1, wherein said membrane comprises an etch-stop material.

3. The device of claim 1, wherein said membrane comprises a single crystal material.

4. The device of claim 1, further comprising a third conductor disposed on said top surface of said membrane, said third conductor and said second conductor connected through a via in said membrane.

5. The device of claim 1, wherein said second conductor further comprises a backside metallization for said substrate.

6. The device of claim 1, wherein said membrane comprises:
   a first dielectric layer disposed on said substrate; and
   a second dielectric layer disposed on said first dielectric layer;
   wherein said first dielectric layer comprises an etch-stop material.

7. The device of claim 6, wherein both said first and said second dielectric layers comprise single crystal materials.

8. The device of claim 6, wherein said substrate comprises gallium arsenide, said first dielectric layer comprises aluminum gallium arsenide, and said second dielectric layer comprises gallium arsenide.

9. The device of claim 1, wherein said first conductor comprises a superconducting material.

* * * * *